(12) United States Patent
Ishii et al.

(10) Patent No.: US 6,520,821 B1
(45) Date of Patent: Feb. 18, 2003

(54) DEVICE PACKAGE AND DEVICE ENCAPSULATION METHOD

(75) Inventors: Ikuko Ishii, Tokyo (JP); Yoshikazu Sakaguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/310,326

(22) Filed: May 12, 1999

(30) Foreign Application Priority Data

May 18, 1998 (JP) ............................................ 10-134969

(51) Int. Cl.⁷ .............................. H01J 9/26; H01J 9/32; H01J 1/62
(52) U.S. Cl. .............................. 445/25; 445/23; 445/24; 445/44; 313/512
(58) Field of Search .............................. 313/504, 506, 313/511, 512; 445/23, 24, 25, 44

(56) References Cited

U.S. PATENT DOCUMENTS

| | | | | |
|---|---|---|---|---|
| 5,003,222 A | * | 3/1991 | Washo | 313/511 |
| 6,049,167 A | * | 4/2000 | Onitsuka et al. | 313/512 |
| 6,057,597 A | * | 5/2000 | Farnworth et al. | 257/710 |
| 6,436,222 B1 | * | 8/2002 | Andre et al. | 313/504 X |

FOREIGN PATENT DOCUMENTS

| | | |
|---|---|---|
| JP | 56-69795 | 6/1981 |
| JP | 59-129447 | 7/1984 |
| JP | 60-80256 | 5/1985 |
| JP | 60-81797 | 5/1985 |
| JP | 61-48697 | 4/1986 |
| JP | 61-114796 | 6/1986 |
| JP | 61-234115 | 10/1986 |
| JP | 63-170891 | 7/1988 |
| JP | 1-186591 | 7/1989 |
| JP | 1-127193 | 8/1989 |
| JP | 2-29196 | 2/1990 |
| JP | 3-112153 | 5/1991 |
| JP | 3-261091 | 11/1991 |
| JP | 4-328292 | 11/1992 |
| JP | 6-348215 | 12/1994 |
| JP | 8-227946 | 9/1996 |
| JP | 8-236271 | 9/1996 |
| JP | 8-330352 | 12/1996 |
| JP | 9-7763 | 1/1997 |
| JP | 9-148066 | 6/1997 |

* cited by examiner

*Primary Examiner*—Kenneth J. Ramsey
*Assistant Examiner*—Mack Haynes
(74) *Attorney, Agent, or Firm*—Katten Muchin Zavis Rosenman

(57) ABSTRACT

In a device encapsulation method, an organic EL device is formed on a substrate. An encapsulation cap is placed on the substrate to surround the device and thereafter an end face of the cap is welded on at least the substrate. A device package is also disclosed.

8 Claims, 3 Drawing Sheets

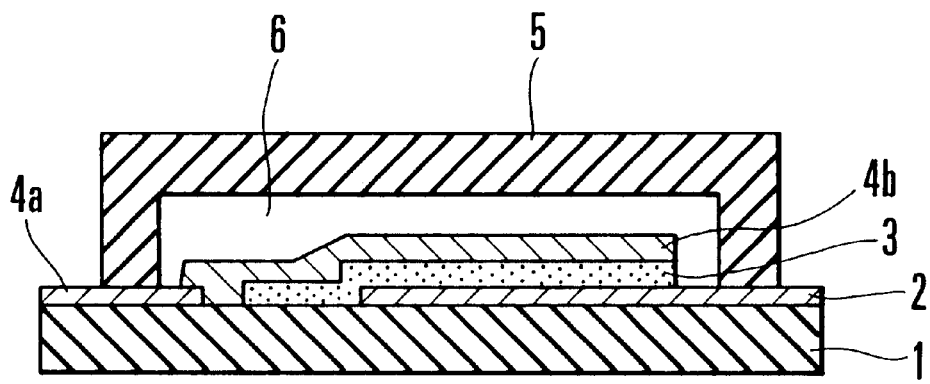
F I G. 2
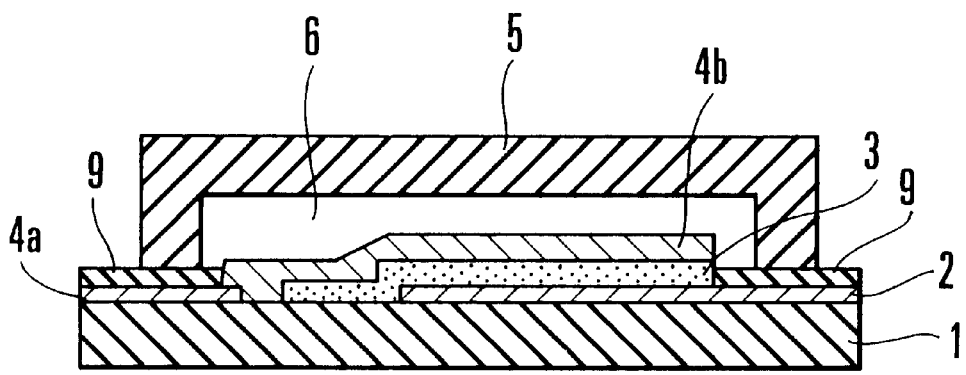
F I G. 3

DEVICE PACKAGE AND DEVICE ENCAPSULATION METHOD

BACKGROUND OF THE INVENTION

The present invention relates to a device package and a device encapsulation method and, more particularly, to an organic electroluminescence (EL) device package and an encapsulation method of encapsulating an organic EL device in a package.

An organic EL device is formed by interposing a multi-layered structure constituted by a light-emitting layer and a hole injection layer/electron injection layer between a pair of electrodes on a substrate. The multilayered structure is constituted by a light-emitting layer made of a fluorescent organic solid such as anthracene and a hole injection layer made of a triphenyl amine derivative or the like; a light-emitting layer and an electron injection layer made of a perylene derivative; or a hole injection layer, a light-emitting layer, and an electron injection layer.

The organic EL device formed in this manner utilizes an emission phenomenon which occurs when electrons and holes injected into the light-emitting layer are recombined. Hence, if the thickness of the light-emitting layer of the organic EL device is decreased, the organic EL device can be driven at a low voltage of, e.g., about 4 V, and has a high response speed.

The fluorescent organic solid as the material of the light-emitting layer of the organic EL device is not resistant to water and oxygen. The characteristics of the electrodes formed on the light-emitting layer directly or through the hole injection layer/electron injection layer tend to be degraded due to oxidation. As a result, if a conventional organic EL device is driven in the atmosphere, its emission characteristics are sharply degraded. To obtain a practical organic EL device, the device must be encapsulated so that water or oxygen does not enter the light-emitting layer, thereby prolonging the service life.

As the encapsulation structure, a structure in which a resin or the like is directly applied to the organic EL device, or a structure in which a gas or liquid is filled in the encapsulation space is available. A filled structure type organic EL device encapsulation method will be described with reference to FIG. 5. As shown in FIG. 5, an anode 12 and a cathode 14a each formed of an indium-tin oxide (ITO) film, an organic EL device 13, and a cathode 14b formed of a metal film are sequentially formed on a glass substrate 11 to form an organic EL device. An encapsulation cap 15 made of glass is placed on the substrate 11 and adhered with an adhesive 18 to encapsulate the organic EL device.

The encapsulation cap 15 has such a shape that it can maintain a hollow portion 16 to be filled with an inert gas. Because of the poor heat resistance of the organic EL device, the substrate 11 and cap 15 are bonded to each other by using room-temperature curing or the UV curing adhesive 18.

In the conventional encapsulation method described above, an interface is present between the substrate 11 and adhesive 18 and between the cap 15 and adhesive 18. Accordingly, external oxygen or water enters from the outside at the interface to cause degradation of the organic EL device, thus shortening the service life of the organic EL device.

SUMMARY OF THE INVENTION

It is an object of the present invention to provide a device package that can prolong the service life of the device, and a device encapsulation method.

In order to achieve the above object, according to the present invention, there is provided a device encapsulation method comprising the steps of forming a device having an anode and a cathode on a substrate made of a thermoplastic resin, and placing a cap made of the same thermoplastic resin as that forming the substrate on the substrate to surround the device and thereafter welding an end face of the cap on at least the substrate.

BRIEF DESCRIPTION OF THE DRAWINGS

FIG. 2 is a longitudinal sectional view of a portion of the organic EL device shown in FIG. 1B where an anode and a cathode are not formed;

FIG. 3 is a longitudinal sectional view of an organic EL device according to the second embodiment of the present invention;

DESCRIPTION OF THE PREFERRED EMBODIMENTS

The present invention will be described in detail with reference to the accompanying drawings.

[First Embodiment]

Figure 1A:
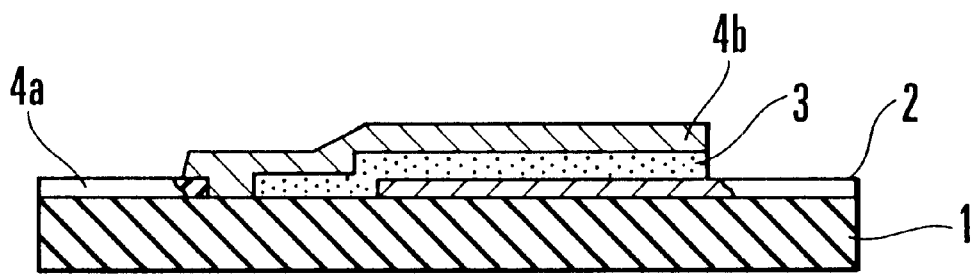
FIGS. 1A and 1B are views showing the steps in manufacturing an organic EL device according to the first embodiment of the present invention.
Figure 1B:
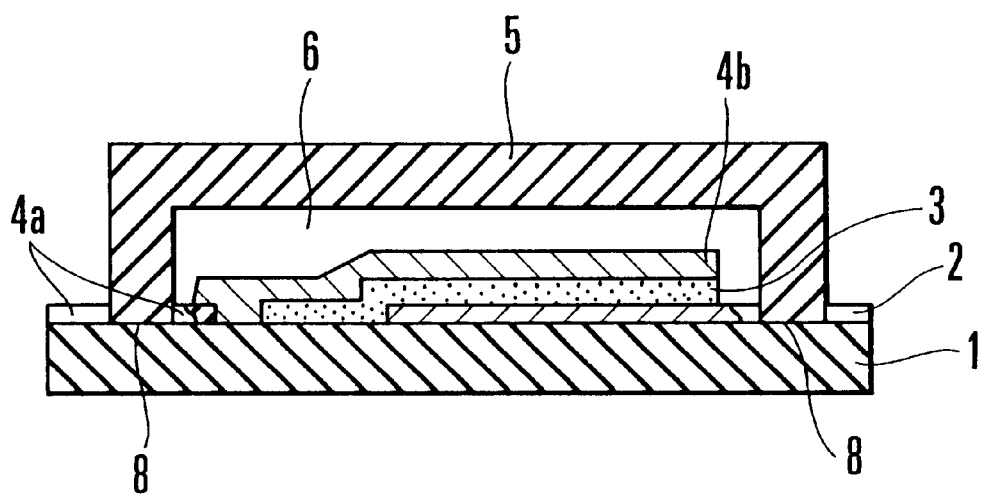

FIGS. 1A and 1B show the steps in manufacturing an organic EL device according to the first embodiment of the present invention. In FIGS. 1A and 1B, the respective portions are illustrated with easily recognizable sizes for the sake of illustrative convenience and accordingly have a film ratio different from the actual one.

As shown in FIG. 1A, an anode 2 and a cathode 4a each formed of an ITO film, an organic EL device 3, and a metal cathode 4b are sequentially formed on a substrate 1. As shown in FIG. 1B, a box- or dome-shaped encapsulation cap 5 made of the same material as that of the substrate 1 and having one open surface is placed on the substrate 1, and its end face and the substrate 1 are welded by using ultrasonic welding. The encapsulation cap 5 has such a shape that it can maintain a hollow portion 6, so that it will not come into direct contact with the cathode 4b. The hollow portion 6 is filled with a gas containing neither oxygen nor water.

As the material of the substrate 1 on which the organic EL device 3 is mounted, an amorphous thermoplastic resin is used. Examples of the amorphous thermoplastic resin are an AS resin, an ABS resin, polypropyrene (PP), polystyrene (HIPS), polymethyl methacrylic acid (PMMA), polycarbonate (PC), and polyoxymethylene (POM).

According to this embodiment, the substrate 1 and encapsulation cap 5 made of the same material are welded to each other. As the substrate 1 and encapsulation cap 5 are integrated and accordingly do not have an interface between them, the internal hermeticity can be maintained for a long period of time.

A method of manufacturing the organic EL device 3 and a method of encapsulating the organic EL device 3 will be described in detail.

To fabricate the organic EL device 3 as the encapsulation target, for example, a 0.5 mm thick polycarbonate (PC) substrate 1 formed with a 100 nm thick ITO film by sputtering was prepared as a transparent support substrate.

The ITO film is used as the anode 2 and cathode 4a for external connection and must perform display by transmitting light generated by the organic EL layer. Hence, the ITO film preferably has high light transmittance as in inorganic glass.

The transparent support substrate is fixed to a substrate holder in a vacuum deposition apparatus such that the ITO film is located below. As a hole injection/hole transport material, an aromatic diamine such as N,N'-diphenyl-N,N-bis(α-naphthyl)-1,1'-biphenyl-4,4'-d iamine (to be referred to as a-NPD hereinafter) is put in a resistance heating boat. As an organic light-emitting material, a tris(8-quinolinolate) aluminum complex (to be referred to as Alq3 hereinafter) is put in another resistance heating boat, and the interior of the vacuum deposition apparatus is evacuated to about $1 \times 10^{-4}$ Pa or less with a vacuum pump.

Subsequently, a metal shadow mask, from which a region where a hole transport layer and an EL light-emitting layer are to be formed by vacuum deposition, is removed, is set on the anode side of the transparent support substrate so as to be fixed to the substrate. A current is supplied to the transparent support substrate and the resistance heating boat loaded with α-NPD and placed below the shadow mask to heat α-NPD. An α-NPD layer having a thickness of about 50 nm is deposited to form the hole transport layer.

A current is supplied to the resistance heating boat loaded with Alq3 to heat Alq3. An alq3 layer having a thickness of 50 nm is thus formed by vacuum deposition, thus forming a green emission layer. Magnesium and silver are formed by vacuum deposition to a thickness of 200 nm to form the cathode 4b. An organic EL device as the encapsulation target is thus fabricated.

Part of the anode 2 formed of the ITO film and part of the cathode 4b formed of a magnesium-silver alloy layer also serve as electrode wires for external connection. In this case, the cathode 4b may be alternatively directly extracted outside the package. Regarding the welding portion of the substrate 1 and encapsulation cap 5, it preferably has a high heat resistance. Hence, the ITO film is used to form the cathode 4a of the welding portion. Pixels each having a size of 0.3 mm×0.3 mm are arranged in the light-emitting layer into a matrix.

In a box filled with nitrogen gas having a dew point of −72° C., the encapsulation cap 5 is placed on the substrate 1 formed with the organic EL device 3. In this box, a bonding portion 8 of the substrate 1 and the end face of the encapsulation cap 5 is vibrated and pressurized in a predetermined direction with ultrasonic honing, thus performing hermetic encapsulation. The width of the bonding portion (welding portion) 8 of the substrate 1 and encapsulation cap 5 is 3 mm. The frequency for honing is set to 15 kHz, and the pressure for pressurization is set to 10 kg/cm² as the primary pressure and 12 kg/cm² as the secondary pressure. The time required for this welding is about 3 seconds. The time required for encapsulation process can thus be shortened.

A DC constant current power supply was connected to the organic EL device 3, encapsulated in the package constituted by the substrate 1 and encapsulation cap 5 in the above manner, through the anode 2 and cathode 4a serving as the electrode wires extracted outside the package. Power was supplied to the organic EL device 3 to an initial luminance of 100 cd/m² at 25° C. in the atmospheric pressure. At this time, the current was 10 mA and the voltage was 9 V. Following this energization, an enlarged picture (×30) of the emission surface was photographed. The ratio of the dark spot (non-emission portion) in a plan view to the total area of the emission surface (to be referred to as the ratio of the non-emission area) was calculated from this photograph to be 0.5%. The diameter of certain one spot was measured to be 7 μm.

This organic EL device was left to stand for 500 hours at 50° C. in a 90% RH atmosphere without being energized. The non-emission area ratio was calculated to be 0.8% in the same manner as that described above. Therefore, it was confirmed that the non-emission area ratio did not substantially change from the initial value. The diameter of the same dark spot as that measured before leaving in the 90% RH atmosphere was measured again to be 10 μm. The diameter did not substantially change from the initial value.

Figure 5:
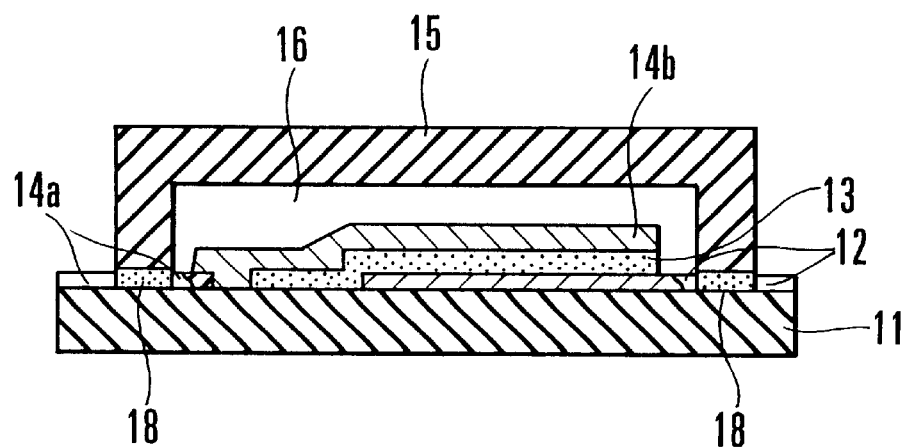
FIG. 5 is a longitudinal sectional view of a conventional organic EL device.

In contrast to this, the conventional organic EL device shown in FIG. 5 was evaluated in the same manner as that described above. The result of this evaluation is as follows. The initial non-emission area ratio was calculated to be 0.4%. The diameter of certain one dark spot was measured to be 6 μm. This device was left to stand for 500 hours at 50° C. in the 90% RH atmosphere without being energized. The non-emission area ratio was calculated to be 3.6%. When the diameter of the same dark spot as that measured before leaving in the 90% RH atmosphere was measured again, it grew to 20 μm.

As described above, according to the encapsulation method of this embodiment, growth of the dark spot can be suppressed when compared to the prior art.

The anode 2 and cathode 4a have elongated shapes, and a plurality of rows of anodes 2 and a plurality of rows of cathodes 4a are formed at predetermined pitches. Each of FIGS. 1A and 1B shows the longitudinal section of a portion of the organic EL device where the anode 2 and cathode 4a are not formed. For the sake of illustrative convenience, the entire portion of the organic EL device 3 and part of the anode 2 and cathode 4a are shown as a section. Accordingly, the encapsulation cap 5 is directly welded to the substrate 1 through portions of the bonding portion 8 where the anode 2 and cathode 4a are absent.

FIG. 2 shows a portion of the organic EL device where the anode 2 and cathode 4a are formed. In FIG. 2, the end face of the encapsulation cap 5 is in contact with the surfaces of the anode 2 and cathode 4a.

[Second Embodiment]

As the second embodiment, in FIG. 3, in order to improve the adhesion properties of welding of a substrate 1 and an encapsulation cap 5, a resin layer 9 made of the same material as that of the substrate 1 is formed by coating in advance on an anode 2 and a cathode 4a that are present between the substrate 1 and encapsulation cap 5. The substrate 1 and encapsulation cap 5 are then welded to each other. At this time, the encapsulation cap 5 is welded to the resin layer 9 at regions on the anode 2 and cathode 4a.

A result obtained by evaluating the organic EL device of this embodiment in accordance with the same method as in the first embodiment is as follows. In contrast to an initial non-emission area ratio of 0.5%, the non-emission area ratio obtained after the organic EL device was left to stand for 500 hours at 50° C. in the 90% RH atmosphere without being driven was 0.7%. Regarding the dark spot diameter, in contrast to an initial value of 5 μm, the value obtained after the organic EL device was left to stand for 500 hours at 50° C. in the 90% RH atmosphere without being driven was 7 μm. In this manner, a better effect than that of the first embodiment was confirmed.

In the first and second embodiments, the encapsulation cap 5 is transparent. As a modification, the entire portion of the encapsulation cap 5, excluding its inner wall or surface bonded with the substrate 1, is colored in black so as to absorb light, and the substrate 1 and encapsulation cap 5 are welded to each other. This can improve the contrast of organic EL emission. Where the conventional contrast is 1:7 to 1:10, in this modification, the contrast is improved to 1:70 to 1:90.

[Third Embodiment]

Figure 4:
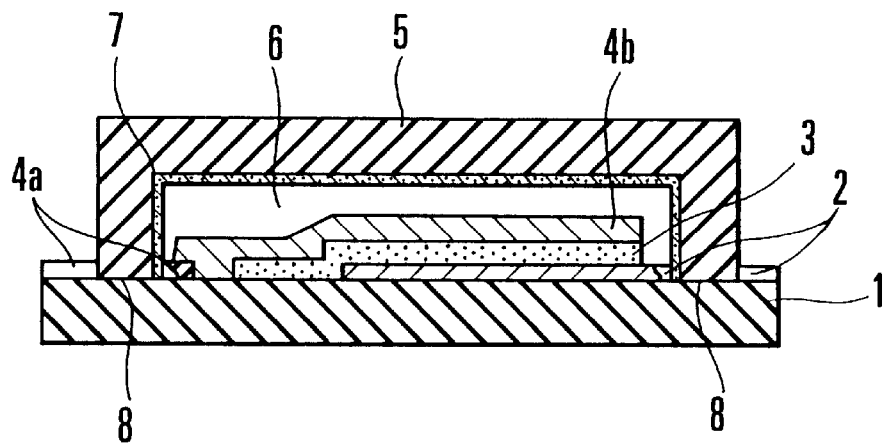
FIG. 4 is a longitudinal sectional view of an organic EL device according to the third embodiment of the present invention.

FIG. 4 shows an organic EL device according to the third embodiment of the present invention. In FIG. 4, portions having the same arrangement as those of FIG. 1B are denoted by the same reference numerals as in FIG. 1B. In the third embodiment, an active carbon layer 7 is formed on the inner wall of an encapsulation cap 5, and thereafter a substrate 1 and the encapsulation cap 5 are welded to each other. This can improve the contrast of organic EL emission, in the same manner as in the above modification. Since a fusion gas generated during ultrasonic welding of the substrate 1 and encapsulation cap 5 is adsorbed by the active carbon layer 7, the service life of the organic EL device can be further prolonged.

A result obtained by evaluating the organic EL device of this embodiment in accordance with the same method as in the first embodiment is as follows. In contrast to an initial non-emission area ratio of 0.4%, the non-emission area ratio obtained after the organic EL device was left to stand for 500 hours at 50° C. in the 90% RH atmosphere without being driven was 0.5%, exhibiting substantially no change. Regarding the dark spot diameter, in contrast to an initial value of 5 $\mu$m, the value obtained after the organic EL device was left to stand for 500 hours at 50° C. in the 90% RH atmosphere without being driven was 6 $\mu$m. A better effect than that of the above modification was confirmed.

As has been described above, according to the present invention, when a substrate and a cap made of the same material are welded to each other, the interface between the substrate and cap can be eliminated. The hermeticity in the package can thus be improved, thus prolonging the service life of the organic EL device.

When the same material as in the substrate is applied in advance to an anode and a cathode present on the welding portion of the substrate and cap, the adhesion properties of the substrate and cap can be improved, thus further prolonging the service life of the organic EL device.

When the inner wall or entire portion of the cap is colored, the contrast of organic EL emission can be improved.

When an active carbon layer is formed on the inner wall of the cap, the contrast of organic EL emission can be improved, and the service life of the organic EL device can be further prolonged.

What is claimed is:

1. A device encapsulation method comprising the steps of:
    forming a device having an anode and a cathode on a substrate made of a thermoplastic resin; and
    placing a cap made of the same thermoplastic resin as that forming said substrate on said substrate to surround said device and thereafter welding an end face of said cap on at least said substrate;
    such that said cathode is separated from said cap.

2. A method according to claim 1, wherein
    said method further comprises the step of forming a thermoplastic resin layer made of the same material as that forming said substrate on externally extending portions of said anode and said cathode, and
    the welding step comprises the step of welding said end face of said cap to said substrate and said thermoplastic resin layer.

3. A method according to claim 1, wherein said device is an organic EL device, and said substrate is a thermoplastic transparent resin substrate.

4. A method according to claim 1, wherein the welding step comprises the step of welding a bonding portion of said substrate and said cap by vibration and pressurization in a predetermined direction in accordance with ultrasonic honing.

5. A method according to claim 1, wherein the thermoplastic resin as a material of said substrate is one material selected from the group consisting of an AS resin, an ABS resin, polypropyrene (PP), polystyrene (HIPS), polymethyl methacrylic acid (PMMA), polycarbonate (PC), and polyoxymethylene (POM).

6. A device encapsulation method comprising the steps of:
    forming a device having an anode and a cathode on a substrate made of a thermoplastic resin;
    coloring an inner wall of a cap made of the same thermoplastic resin as that forming said substrate; and
    placing said cap on said substrate to surround said device and thereafter welding an end face of said cap on at least said substrate.

7. A device encapsulation method comprising the steps of:
    forming a device having an anode and a cathode on a substrate made of a thermoplastic resin;
    coloring entirely a cap made of the same thermoplastic resin as that forming said substrate; and
    placing said cap on said substrate to surround said device and thereafter welding an end face of said cap on at least said substrate;
    wherein said device is an organic EL device, and said substrate is a thermoplastic transparent resin substrate.

8. A device encapsulation method comprising the steps of:
    forming a device having an anode and a cathode on a substrate made of a thermoplastic resin;
    forming an active carbon layer on an inner wall of a cap made of the same thermoplastic resin as that forming said substrate; and
    placing said cap on said substrate to surround said device and thereafter welding an end face of said cap on at least said substrate;
    wherein said device is an organic EL device, and said substrate is a thermoplastic transparent resin substrate.

* * * * *